United States Patent
Okino

(10) Patent No.: US 6,376,137 B1
(45) Date of Patent: Apr. 23, 2002

(54) CHARGED-PARTICLE-BEAM MICROLITHOGRAPHY APPARATUS AND METHODS INCLUDING CORRECTION OF STAGE-POSITIONING ERRORS USING A DEFLECTOR

(75) Inventor: Teruaki Okino, Kamakura (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/595,552

(22) Filed: Jun. 15, 2000

(30) Foreign Application Priority Data

Jun. 15, 1999  (JP) .......................................... 11-167857

(51) Int. Cl.⁷ ................................................ G03F 9/00
(52) U.S. Cl. ........................... 430/22; 430/30; 430/296; 430/942; 250/492.2; 250/492.22; 250/492.3
(58) Field of Search ........................... 430/22, 30, 296, 430/942; 250/492.2, 492.22, 492.3

(56) References Cited

PUBLICATIONS

Sakamoto et al., "Electron–Beam Block Exposure System for a 256 M Dynamic Random Access Memory," *J. Vac. Sci. Technol. B* 11:2357–2361 (1993).

*Primary Examiner*—Christopher G. Young
(74) *Attorney, Agent, or Firm*—Klarquist Sparkman LLP

(57) ABSTRACT

Charged-particle-beam microlithography apparatus and methods are disclosed that achieve correction of positioning errors of one or both the reticle stage and wafer stage using a deflector. The deflector is situated in one or both lenses of the projection-optical system of the apparatus. The deflector preferably is electrostatic for rapid responsiveness, and desirably is configured also to correct distortions corresponding to the positioning errors.

12 Claims, 5 Drawing Sheets

CHARGED-PARTICLE-BEAM MICROLITHOGRAPHY APPARATUS AND METHODS INCLUDING CORRECTION OF STAGE-POSITIONING ERRORS USING A DEFLECTOR

FIELD OF THE INVENTION

This invention pertains to microlithography (projection-transfer) of a pattern, defined by a reticle, to a sensitive substrate using a charged particle beam as an energy beam. Microlithography is used generally in the fabrication of semiconductor integrated circuits and displays. More specifically, the invention pertains to correcting positioning errors of the reticle stage and/or wafer stage in such microlithography apparatus.

BACKGROUND OF THE INVENTION

Charged-particle-beam (CPB) microlithography (e.g., microlithography performed using an electron beam) is a promising method for used in fabrication of semiconductor integrated circuits, displays, and other devices demanding the accurate transfer of extremely fine patterns (having linewidths of 0.1 $\mu$m or less).

Although CPB microlithography offers prospects of very high resolution, a disadvantage with current CPB microlithography techniques is low "throughput," by which is meant the number of wafers that can be processed per unit time. Various technical approaches have been investigated to improve throughput.

One group of current approaches is the so-called "partial pattern block exposure" methods such as cell projection, character projection, and block exposure. In partial pattern block exposure, small repeatable portions of the circuit pattern (on the order of 5 $\mu$m on the wafer) are exposed repeatedly onto the wafer from a reticle (mask) defining a number of different such small portions. Unfortunately, before or after exposing the repeated portions, the non-repeated portions of the pattern must be exposed, which is achieved typically by "direct writing" the pattern elements in the non-repeated portions element-by-element using variable-shaped beam. Consequently, throughput is too low for mass-production of wafers.

CPB "projection" microlithography was proposed as a possible solution to the throughput problem. For example, it has been proposed to projection-expose an entire pattern from the reticle to the wafer in one "shot"(usually with the image on the wafer being "demagnified" relative to the pattern on the reticle). Whereas this approach offers tantalizing prospects of high throughput, it has daunting technical problems. First, it is extremely difficult to fabricate a reticle for CPB projection microlithography that can be exposed in one shot. Attempts to fabricate such a reticle have resulted in reticles that have inadequate mechanical strength and rigidity for use. Second, it is extremely difficult to fabricate CPB optical systems (comprising electromagnetic lenses, deflectors, and the like) having a sufficiently wide optical field to expose an entire reticle in one shot. It is especially difficult to fabricate such lenses that do not exhibit substantial off-axis aberrations that prevent achieving the desired fidelity and dimensional accuracy of the transferred pattern.

In view of the above, so-called "divided-reticle" CPB microlithography methods have received considerable research attention. In divided-reticle approaches, the CPB optical system has a relatively large field. However, rather than exposing an entire die (typically corresponding to a single "chip" on the wafer), or even multiple dies, in one shot, the pattern as defined on the reticle is divided into multiple small regions (termed "subfields"), that are exposed individually onto the wafer in a sequential manner. As exposure progresses, the charged particle beam is deflected to the subfields in succession. Meanwhile, adjustments are made as required to correct the focus of the corresponding subfield image as formed on the wafer surface, and to correct aberrations such as distortion. The images of the subfields are formed contiguously (i.e., "stitched" together) on the wafer in the proper order to form the entire pattern.

Unlike CPB microlithographic approaches in which an entire die is transferred in one shot, divided-reticle microlithography can provide accurate pattern exposures with high resolution over an optically large field. By continuously moving the reticle and wafer during exposure, a large exposure area can be patterned at an acceptable throughput.

Certain aspects of a conventional divided-reticle electron-beam microlithography system are depicted in FIG. 3, in which the most upstream component shown is an electron gun 1. The electron gun 1 emits an electron beam EB that propagates in a downstream direction along an optical axis AX. Downstream of the electron gun 1 are first and second condenser lenses 2, 3, respectively. The electron beam EB passes through the condenser lenses 2, 3 to form a crossover image C.O.1. The crossover image C.O.1 is located on the optical axis AX at a blanking aperture 7.

A beam-shaping aperture 4 is situated between the second condenser lens 3 and the blanking aperture 7. The beam-shaping aperture 4 defines an axial opening that is sized and shaped to pass therethrough only a portion of the electron beam EB sufficient to illuminate a single exposure unit ("subfield") of a downstream reticle 10. For example, if the subfields on the reticle 10 are rectangular in shape (each subfield on the reticle usually is sized and shaped identically), then the beam-shaping aperture 4 defines a corresponding rectangular axial opening. If the subfields on the reticle 10 are square in shape and have an area of, e.g., $(1 \text{ mm})^2$, then the beam-shaping aperture 4 defines an axial opening sufficient to provide the electron beam, as incident on the reticle, with a square transverse profile with each side of the square being slightly greater than 1 mm. An image of the axial opening defined by the beam-shaping aperture 4 is formed on the reticle 10 by a collimating lens 9 situated between the blanking aperture 7 and the reticle 10.

The electron beam EB propagating between the electron gun 1 and the reticle 10 is termed herein the "illumination beam" IB. The portion of the electron-optical system (including the lenses 2, 3, 9 and the apertures 4, 7) is termed herein the "illumination-optical system."

The illumination-optical system also includes a blanking deflector 5 disposed downstream of the beam-shaping aperture 4. The blanking deflector 5, when energized, deflects the illumination beam IB laterally so as to cause the entire illumination beam IB to be blocked as required by the blanking aperture 7 during moments when no exposure is occurring or desired.

The illumination-optical system also includes a selection deflector 8 situated downstream of the blanking aperture 7. The selection deflector 8 deflects the illumination beam IB mainly in the X-, or left-right, direction (note axes shown in the figure) in a scanning manner. By scanning the illumination beam IB in this manner, successive subfields on the reticle 10 located within the field of the illumination-optical system are illuminated. Thus, the FIG.-3 apparatus exposes the subfields of the reticle 10 in a scanning manner. The collimating lens 9, situated downstream of the selection deflector 8, collimates the illumination beam IB for impingement on a desired subfield of the reticle 10. Thus, an image of the axial opening defined by the beam-shaping aperture 4 is focused on the reticle 10.

In FIG. 3, only a single subfield (centered on the optical axis AX) is shown. An actual reticle 10 extends outward in the X-Y plane and defines many subfields. In any event, the reticle 10 defines a pattern (chip pattern) for a single semiconductor device ("die") to be formed on a downstream substrate 23, and each subfield defines a respective portion of the pattern.

As noted above, the illumination beam IB is deflected laterally to illuminate successive subfields situated within the field of the illumination-optical system. (Hence, multiple subfields desirably fall within the field of the illumination-optical system.) To illuminate a subfield situated outside the field of the illumination-optical system, the reticle 10 is moved relative to the illumination-optical system. To such end, the reticle 10 is mounted on a reticle stage 11 that is movable in the X- and Y-directions.

As the illumination beam IB passes through the illuminated subfield on the reticle 10, the electron beam becomes capable of forming an image of the illuminated subfield on the substrate 23. Hence, the electron beam propagating downstream of the reticle 10 is termed herein the "patterned beam" PB. The electron-optical system located between the reticle 10 and the substrate 23 is concerned primarily with projecting the image onto the desired location on the substrate 23. Hence, that electron-optical system is termed herein the "projection-optical system."

The projection-optical system includes first and second projection lenses 15, 19, respectively, typically are configured as a "symmetric magnetic doublet"(SMD). The first and second projection lenses 15, 19 operate in concert to form a "reduced" image of the illuminated reticle subfield on the substrate 23. By "reduced" is meant that the image as formed on the substrate is smaller than, or "demagnified" relative to, the corresponding illuminated portion of the reticle 10 by a factor termed the "demagnification ratio." The demagnification ratio is a factor such as 1/4 or 1/5.

The projection-optical system also includes a deflector 16. The deflector 16 laterally deflects the patterned beam as required to cause the patterned beam to form the image of the illuminated subfield at a desired location on the substrate 23.

The surface of the substrate (or "wafer") 23 is coated with an appropriate resist so as to be imprinted with the demagnified image when dosed by the patterned beam PB. The demagnified images of successively illuminated subfields are formed on the wafer 23 such that all the images are contiguous with each other (i.e., "stitched" together) in the proper order and arrangement to form the complete die pattern on the wafer. Proper stitching together of the images on the wafer 23 is facilitated by mounting the wafer on a wafer stage 24 that is moved controllably as required in the X- and Y-directions and by deflecting the patterned beam for each image using the deflector 16.

The first projection lens 15 causes the patterned beam PB to form a crossover image C.O.2 on the optical axis upstream of the second projection lens 19. At the crossover image C.O.2, the axial distance between the reticle 10 and wafer 23 is divided such that the axial distance from the reticle 10 to the crossover image C.O.2, divided by the axial distance from the crossover image C.O.2 to the wafer 23, is equal to the inverse of the demagnification ratio. The crossover image C.O.2 is also the location, along the optical axis AX, of a "contrast aperture"18. The contrast aperture 18 blocks charged particles in the patterned beam PB that were scattered upstream by the illumination beam encountering non-patterned regions of the reticle 10. Thus, the scattered particles are prevented from propagating to the wafer 23.

A backscattered-electron (BSE) detector 22 is situated between the second projection lens 19 and the wafer 23. The BSE detector 22 detects backscattered electrons produced when the patterned beam PB strikes certain regions (e.g., alignment marks or analogous features) on the wafer 23. The positions of the alignment marks on the wafer 23 are ascertained from characteristics of the BSE signal produced by the BSE detector 22. Thus, basic data concerning positions of the reticle and wafer, and alignments between the wafer 23 and the electron-optical system or between the wafer 23 and reticle 10, are obtained.

The wafer 23 desirably is mounted on an electrostatic chuck (not shown) that, in turn, is mounted on the wafer stage 24. The wafer stage 24 moves the chuck (and thus the wafer 23) in the X- and Y-directions. The various subfields of the chip pattern on the reticle 10 can be exposed successively by synchronously scanning the reticle stage 11 and the wafer stage 24 in opposite directions. The axis along which these stage scannings are performed is perpendicular to the axis along which lateral beam scanning is performed. The respective positions of the stages 11, 24 are determined accurately, in real time, using respective position sensors 12, 25 each employing one or more laser interferometers. Extremely accurate positional measurements are required to obtain accurate stitching together of the demagnified images, on the wafer 23, of the illuminated reticle subfields.

The lenses 2, 3, 9, 15, 19 and the deflectors 5, 8, 16 are controlled by a main controller (e.g., microprocessor) 31 via respective coil power supplies, 2a, 3a, 9a, 15a, 19a, 5a, 8a, 16a. Also, the reticle stage 11 and wafer stage 24 are controlled by the main controller 31 via respective stage drivers 11a, 24a, and the position sensors 12, 25 are controlled by the main controller 31 via respective interface units 12a, 25a. Data from the BSE detector 22 are routed to the main controller 31 via an interface 22a. The main controller 31 determines stage-position control errors, and corresponding corrections to be imparted by the deflector 16, which also facilitates accurate stitching.

A divided reticle 10 as used with the FIG.-3 apparatus is described with reference to FIGS. 4(A)–4(C). Such a reticle typically is made by electron-beam direct writing, and etching. The reticle 10 comprises a reticle membrane 42 partitioned into multiple subfields 41. The subfields 41 in this example are square-shaped and similarly sized. Depending upon the type of reticle (e.g., scattering-membrane type or scattering-stencil type), the membrane 42 has a thickness ranging from about 0.1 $\mu$m to several $\mu$m. Each subfield 41 defines a respective portion of the pattern defined by the reticle. The subfields 41 on a given reticle typically have identical size and shape (typically square or rectangular), ranging from 0.5 mm square to 5 mm square on the reticle. When projected at a demagnification ratio of 1/5, these subfields produce corresponding images on the wafer 23 measuring 0.1 mm square to 1 mm square, respectively.

Referring to FIG. 4(C), each individual subfield 41 is surrounded by skirt 43 that is defined on the membrane 42 but does not define any portion of the pattern. During exposure of a subfield, 41, the edges of the illumination beam fall within the skirt 43. Referring to FIG. 4(B), extending (in the Z-direction) from the membrane 42 between individual subfields 41 are struts 45 that extend lengthwise in the X- and Y-directions. Thus, in each space between intersecting struts 45 is a respective subfield 41 surrounded by a skirt 43. The struts 45 collectively form a supporting lattice (termed "grillage") for the subfield membranes 42. The thickness of each strut 45 in the Z-direction is typically 0.5 to 1 mm, and the width of each strut 45 in the X- or Y-direction is typically about 0.1 mm. Struts having these dimensions provide the reticle 10 with substantial rigidity.

Referring to FIG. 4(A), the subfields 41 are arrayed in groups 49 termed "stripes." The stripes 49 are separated from one another by large struts 47. The large struts 47 are integral with the struts 45. The thickness of each large strut 47 in the Z-direction is typically 0.5 to 1 mm, and the width of each large strut 47 in the X- or Y-direction is typically several mm. The large struts 47, in combination with the struts 45, further increase the rigidity and mechanical strength of the reticle 10.

Each stripe 49 comprises multiple subfields 41 linearly arrayed in multiple rows 44 (each row 44 is extended longitudinally in the X-direction). Each such row 44 is termed a "deflection field" because the length of a row (in the X-direction) falls within the field of the illumination-optical system, and the length (in the X-direction) represents the maximum lateral deflection that can be imparted to the illumination beam IB by the selection deflector 8 (FIG. 3). The width of each reflection field 44 (in the Y-direction) corresponds to the width (in the Y-direction) of each subfield 41 of the deflection field 44. FIG. 4(A) shows all the subfields 41 in each deflection field 44 separated from each other by struts 45. In an alternative configuration, the subfields 41 in each deflection field 44 are contiguous and lack intervening struts 45, but struts are situated between adjacent deflection fields. In any event, each deflection field 44 has a "band-shaped" profile that is extended longitudinally in a first direction (here, the X-direction) perpendicular to the optical axis AX, relative to a second direction (here, the Y-direction) perpendicular to the optical axis AX.

Each stripe 49 consists of an array (extending in the Y-direction) of multiple deflection fields 44. In view of the length (in the X-direction) of each deflection field, the width of each stripe 49 is also no greater than the maximum lateral deflection, at the reticle, that can be imparted to the illumination beam IB by the selection deflector 8. The array of stripes extends across the reticle 10 in the X-direction.

The stripes 49 (and deflection fields 44 of each stripe 49) are arranged such that the subfields 41 in each deflection field 44 of each stripe can be illuminated sequentially by the illumination beam IB. Also, in a given stripe 49, the deflection fields 44 are illuminated sequentially. The subfields 41 in each deflection field 44 are exposed sequentially by continuously scanning the illumination beam in the X-direction. As the beam scans the subfields 41 in a deflection field, the reticle stage 11 and wafer stage 24 are moving in the Y-direction (but in opposite directions) to position the next deflection field 44 for scanning after completing scanning of the current deflection field. When exposure of a stripe 49 is complete, scanning motions of the illumination beam and stages stop momentarily for the reticle stage 11 and wafer stage 24 to move stepwise to respective positions appropriate for beginning exposure of the next stripe 49.

During projection exposure of the subfields 41, areas of the reticle in the skirts 43 (including the grillage) are not exposed. Hence, the positions of the corresponding subfield images on the wafer 23 are such that all the images of the pattern are contiguous with each other on the wafer (i.e., the images are "stitched together" properly). By way of example, if the demagnification ratio is 1/5, a die as formed on the wafer measuring 27×44 mm (e.g., for a 4-gigabit DRAM) would have a size on the reticle (including grillage) of approximately 150×230 mm to 200×330 mm.

Further details of pattern transfer from the reticle 10 to the wafer 23 are shown in FIG. 5. Shown at the top of the drawing is an end of a stripe 49 of the reticle 10. As described above, the stripe 49 consists of multiple subfields 42 (skirts not shown) and grillage 45. At the bottom of the drawing, opposite the reticle 10, is the wafer 23. In the left-hand corner of the stripe 49 shown, a subfield 42-1 is being illuminated from above by the illumination beam IB. As the illumination beam IB passes through the subfield 42-1, the beam becomes the patterned beam PB. The projection lenses 15, 19 and deflector 16 (not shown) demagnify the patterned beam PB and project the patterned beam onto the prescribed area of the wafer 23 (i.e., the "transfer subfield"52-1).

The "image-transfer position"(the location on the wafer 23 in which the image is being transferred) is adjusted as required by the deflector 16 (FIG. 3) to ensure that the edges of adjacent transfer subfields 52 touch each other. In other words, if the patterned beam PB passing through the pattern sub-areas 42 simply were converged on the wafer 23 by the projection lenses 15, 19, the images of not only the individual subfields 42 but also "non-patterned areas" such as grillage 45 and skirts 43 would be transferred to the wafer. This would create unexposed areas (corresponding to the non-patterned areas) between adjacent transfer subfields 52 on the wafer 23.

To eliminate such unexposed areas, each image-transfer position is adjusted by an amount corresponding to the width of the non-patterned areas of adjacent subfields. A deflector other than the deflector 16 shown in FIG. 3 (i.e., a deflector that is disposed at an appropriate position in the axial direction) is sometimes provided for this purpose. This additional deflector may be used instead of, or in conjunction with, the deflector 16.

Large-deflection-field microlithographic exposure systems such as the one described above commonly use electromagnetic deflectors to obtain large magnitudes of deflection while providing some correction of aberrations. Exemplary systems in this regard include systems based on MOL (moving objective lens), VAL (variable axis lens), and VAIL (variable axis immersion lens).

Although electromagnetic deflectors are effective for correcting or at least reducing aberrations, they unfortunately exhibit slow responsiveness to energization due to hysteresis and formation of eddy currents. (The response rate (i.e., the time required to make a transition from one steady-state condition to another) of an electromagnetic deflector is normally a few tens of microseconds or greater.) In a conventional CPB microlithography system, reticle-stage and wafer-stage positioning errors are corrected by feeding back corrective data to beam deflectors. If the reticle stage and wafer stage are configured for continuous motion and/or have been reduced maximally in mass to exhibit higher accelerations and velocities, then the responsiveness of deflectors used in the CPB microlithography system should be correspondingly faster.

In microlithography systems having stages configured for continuous motion (and that have low mass), if beam-position correction is performed using electromagnetic deflectors, then the response rate of the deflectors does not match that of the stages.

SUMMARY OF THE INVENTION

In view of the shortcomings of conventional apparatus and methods as discussed above, an object of the invention is to provide, inter alia, improved charged-particle-beam (CPB) microlithography methods. In the methods, an illumination beam is directed by an illumination-optical system to irradiate a region on a reticle mounted to a reticle stage and defining a pattern to be transferred to a sensitive substrate. A corresponding patterned beam propagating downstream of the reticle from the irradiated region of the reticle is directed by a projection-optical system, comprising projection lenses, to projection-image the irradiated region of the reticle on an exposure surface of the sensitive substrate mounted to a wafer stage. The methods are especially directed to correcting a positional error ($\Delta P_w$) of the wafer stage and a positional error ($\Delta P_m$) of the reticle stage.

During actual use of a CPB microlithography apparatus, it is not always possible to achieve accurate positioning of both the substrate and reticle to ideal predetermined respective locations for achieving the most accurate imaging of the reticle pattern onto the substrate. The positional errors $\Delta P_M$, $\Delta P_W$ are measured by interferometry. If $\Delta P_M$ and/or $\Delta P_W$ are not zero, then other positional errors should be considered. I.e., a non-zero $\Delta P_M$ and/or $\Delta P_W$ indicates a misadjustment or mismatching of the subfield position and the combined fields of the lenses and deflectors used to project the subfield image onto the substrate. This mismatching generates additional positional errors, here termed "deflection-based positional errors." This additional error typically is less than any mechanical stage-position error. Methods according to the invention provide rapid correction of positional errors caused by mechanical errors in stage positions as well as deflection-based positional errors.

In an embodiment of methods according to the invention, an electrostatic deflector is provided that is situated within the projection-optical system, and respective electromagnetic deflectors are provided that are situated within the illumination-optical system and the projection-optical system. The respective positional errors ($\Delta P_M$, $\Delta P_W$) of the reticle stage and wafer stage, respectively, are measured from respective predetermined ideal positions for the stages. During exposure of the irradiated region of the reticle onto the substrate, the electromagnetic deflector is energized to reduce the aberration of the projection lenses. The electrostatic deflector is energized as appropriate to correct at least stage-related positional errors ($\Delta P_M$, $\Delta P_W$).

In the embodiment summarized above, the projection-optical system typically comprises first and second projection lenses (the second projection lens is downstream of the first projection lens). In such a situation, the electrostatic deflector is provided within the second projection lens.

The second projection lens desirably comprises a respective auxiliary lens inside of which is situated the respective electromagnetic deflector. In such a situation, the electrostatic deflector desirably is provided inside the electromagnetic deflector.

The first projection lens desirably comprises a respective auxiliary lens. In such a situation, the respective auxiliary lenses of the first and second projection lenses are energized during exposure of the irradiated region of the reticle so as to adjust focus, rotation, and demagnification of an image of the irradiated region of the reticle as formed on the substrate.

The electrostatic deflector desirably is energized so as to provide a correction expressed as:

$$-(\Delta P_M + \Delta P_W) + P_{M\text{-distortion}} + P_{W\text{-distortion}}$$

wherein $1/M$ is the demagnification ratio of the projection-optical system; $\Delta P_M = P_{M\text{-actual}} - P_{M\text{-ideal}}$, wherein $P_{M\text{-actual}}$ is the actual reticle-stage position during an exposure of a given subfield, and $P_{M\text{-ideal}}$ is the corresponding ideal reticle-stage position for $P_{M\text{-actual}}$; and $\Delta P_W = P_{W\text{-actual}} - P_{W\text{-ideal}}$, wherein $P_{W\text{-actual}}$ is the actual wafer-stage position during an exposure of the given subfield, and $P_{W\text{-ideal}}$ is the corresponding ideal wafer-stage position for $P_{W\text{-actual}}$; $P_{M\text{-distortion}}$ is a deflection-based positional error caused by optical distortion arising from a position error at the reticle (as measured at the substrate); and $P_{W\text{-distortion}}$ is a deflection-based positional error caused by optical distortion arising from a position error at the wafer.

The method further can include providing an alignment mark at a substrate plane (e.g., on the substrate or wafer stage). The alignment mark is irradiated with the charged particle beam so as to cause the alignment mark to produce backscattered electrons. The backscattered electrons are detected to obtain a measurement of a positional relationship of the wafer stage to the projection-optical system. The steps of irradiating the alignment mark and detecting the backscattered electrons can be performed before exposing the irradiated region of the reticle onto the substrate.

Thus, the electrostatic deflector is used to make corrections of reticle-stage and wafer-stage positioning errors (i.e., respective displacements from ideal positions) are made sufficiently rapidly.

An embodiment of a CPB microlithography apparatus according to the invention comprises an illumination-optical system, a reticle stage, a wafer stage, and a projection-optical system. The illumination-optical system is situated and configured to illuminate, with a charged-particle illumination beam, a region of a reticle defining a pattern to be transferred to a sensitive substrate. The reticle stage is situated and configured to hold and move the reticle as the reticle is being illuminated by the illumination beam. (The illumination beam passing through the region becomes a patterned beam that carries an image of the illuminated region.) The wafer stage is situated and configured to hold and move the sensitive substrate for exposure with the reticle pattern by the patterned beam. The projection-optical system is situated between the reticle stage and the wafer stage and configured to projection-image, on an exposure surface of the sensitive substrate. The projection-optical system comprises an electromagnetic deflector situated and configured to deflect the patterned beam so as to increase an area exposed by the patterned beam on the exposure surface. The projection-optical system also includes an electrostatic deflector situated and configured to deflect the patterned beam sufficiently to correct a position error of the wafer stage or the reticle stage, or both stages, and thereby adjust a pattern-transfer position on the exposed surface. The apparatus also includes a controller connected to the illumination-optical system, the projection-optical system, the reticle stage, the wafer stage, the electromagnetic deflector, and the electrostatic deflector.

The controller desirably is configured to move the wafer stage continuously during an exposure shot of the patterned beam on the surface of the sensitive substrate, and to energize the electrostatic deflector during the exposure shot to correct the pattern-transfer position during the shot.

More specifically, the controller desirably is configured to energize the electrostatic deflector to impart a correction of $-(\Delta P_M/M + \Delta P_W)$, wherein $\Delta P_M$, $\Delta P_W$, and $1/M$ are as defined above. The controller desirably is further configured to cause the electrostatic deflector to impart a positional correction of:

$$-(\Delta P_M/M + \Delta P_W) + P_{M\text{-distortion}} + P_{W\text{-distortion}}$$

wherein $P_{M\text{-distortion}}$ and $P_{W\text{-distortion}}$ are as defined above.

Another embodiment of an apparatus comprises an illumination-optical system as summarized above, a wafer stage and reticle stage as summarized above, and a projection-optical system. The projection-optical system is situated between the reticle stage and the wafer stage and is configured to projection-image, on an exposure surface of the sensitive substrate. The projection-optical system comprises an electrostatic deflector situated and configured to correct a positioning error of the wafer stage or the reticle stage, or both, by deflecting the patterned beam sufficiently to adjust the pattern-transfer position on the exposure surface.

The positioning errors noted above are relative to respective ideal (target) positions of the stages. The positioning errors are determined by position measurements and desirably are fed back to a controller that determines a magnitude of a beam deflection to be imparted by the electrostatic deflector to correct a corresponding transfer position on the wafer. The response of an electrostatic deflector is extremely fast, normally less than a microsecond. (The response rate is dependent on, for example, the characteristics of digital-to-analog converters, amplifiers, and other circuitry used to drive the electrodes of the deflector, but response times are normally less than a microsecond.) Hence, an electrostatic deflector can keep pace with unexpectedly rapid stage motions and make accurate position corrections.

As noted above, corrections desirably are performed while continuously moving the wafer stage. Whenever continuously moving stages are used, correction of transfer positions during exposures (i.e., while the stages are moving) is advantageous for maintaining throughput and for obtaining maximal exposure accuracy.

The electrostatic deflector also can be used for detecting marks (alignment marks, fiducial marks, and the like). Hence, reticle/wafer alignment and calibration of the CPB-optical systems of the apparatus are performed by scanning the charged particle beam while the marks are being detected. By using the same deflector for alignment and calibration of beam position, throughput is improved.

The foregoing and additional features and advantages of the invention will be more readily apparent from the following detailed description, which proceeds with reference to the accompanying drawings.

BRIEF DESCRIPTION OF THE DRAWINGS

FIG. 4(A) is a plan view of the reticle, FIG. 4(B) is an oblique view of a portion of the reticle, and FIG. 4(C) is a plan view of a subfield of the reticle.

DETAILED DESCRIPTION

The following discussion is given in the context of electron-beam microlithography. However, it will be understood that the general principles described herein can be applied with ready facility to use of an alternative charged particle beam such as an ion beam.

Figure 1:
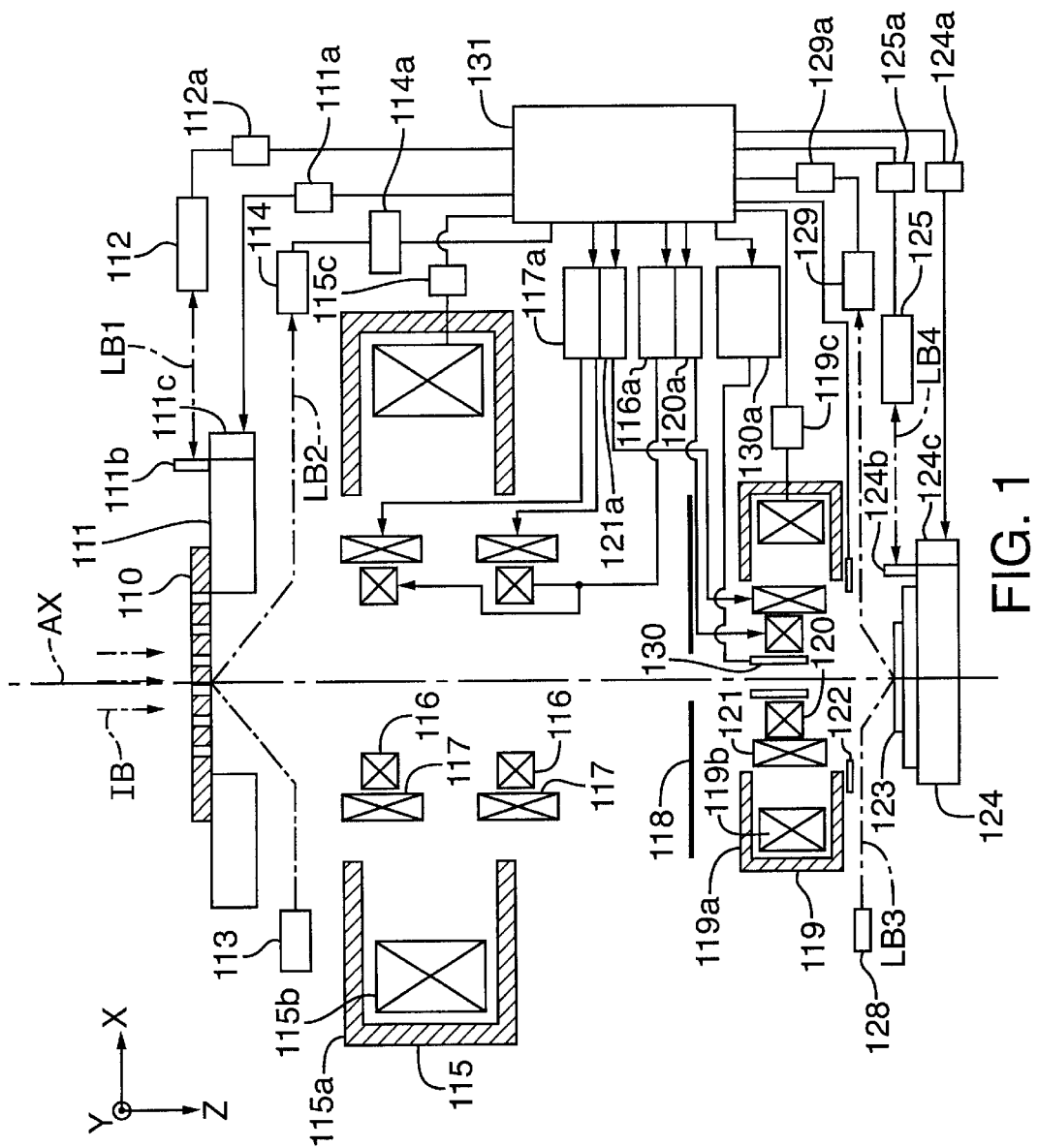
FIG. 1 is an elevational schematic depiction of certain details of the reticle stage, projection-optical system, and wafer stage of a representative embodiment of an electron-beam microlithography apparatus according to the present invention.

With respect to a representative embodiment of a charged-particle-beam (CPB) microlithography system according to the invention, FIG. 1 shows certain details of the portion of the system between the reticle 110 and the wafer 123.

The reticle 110 is mounted on a reticle stage 111 that includes a mirror 111b. A reticle-stage-position sensor 112 measures the position of the reticle stage 111 in the X-direction, desirably by laser interferometry. I.e., a laser beam LB1 is emitted toward the mirror 111b and light reflected from the mirror 111b is received. Although only one reticle-stage-position sensor 112 is shown in the figure, the sensor 112 desirably comprises two parallel sensor units separated from each other in the Y-direction and situated so as to emit respective parallel laser beams toward (and receive the respective reflected laser beam from) the mirror 111b. The use of two sensor units to measure the X-direction position of the reticle stage 111 at two respective locations allows measurement of the rotation of the reticle stage 11 (about the optical axis AX of the system, extending in the Z-direction). Another reticle-stage-position sensor (not shown) is provided for obtaining measurements in the Y-direction.

Further with respect to the reticle stage 111, a measurement sensor also is provided for obtaining measurements of the reticle position in the Z-direction (i.e., elevational measurements of the reticle 110). To such end, a laser beam LB2 from a laser source 113 is directed at the under-surface of the reticle 110, and the resulting reflected light is received by a reticle-elevation sensor 114. This type of measurement sensor is termed a "grazing-incidence" type sensor. The reticle position, as measured by the sensors 112, 114, is input via respective interface units 112a, 114a to a controller 131.

The reticle stage 111 is driven by reticle-stage drivers (e.g., linear motors). Although only one reticle-stage driver 111c is shown in the figure, four drivers 111c desirably are provided: a respective driver for movement in each of the X-, Y-, and Z-directions, and a driver for rotation. The reticle-stage drivers 111c receive respective drive commands from the controller 131 via a stage-control unit 111a.

A substrate ("wafer") 123 is mounted to a wafer stage 124. Wafer-stage position sensors are provided, similar to the reticle-stage-position sensors discussed above. An X-direction wafer-stage-position sensor 125 is shown. A sensing unit 128 or sensor unit 129 is used for measuring wafer displacement in the Z-direction. The sensor 125 directs a laser beam LB4 to a mirror 124b, and receives laser light reflected from the mirror 124b. Data from the sensors 125,129 are input to the controller 131 via respective interface units 125a, 129a. The wafer stage 124 also is provided with four respective drivers for moving the wafer stage in the X-, Y-, and Z-directions and for rotating the wafer, similar to corresponding drivers provided for the reticle stage 111. (One driver 124c is shown, which receives respective drive commands from the controller 131 via a stage-control unit 124a.)

First and second projection lenses 115, 119 comprise a key portion of the projection-optical system of this embodiment. The projection lenses 115, 119 satisfy requirements for being an SMD (symmetric magnetic doublet). Each projection lens 115, 119 comprises a respective magnetic pole-piece 115a, 119a and a respective excitation coil 115b, 119b. Situated in the inside diameter of each of the projection lenses 115, 119 is a respective auxiliary lens 117, 121 and a respective electromagnetic deflector 116, 120. The auxiliary lenses 117, 121 adjust the focus, rotation, and demagnification of the pattern image formed by the projection-optical system. The electromagnetic deflectors 116, 120 not only reduce aberrations in the projection-optical system but also prevent regions corresponding to struts and skirts on the reticle 110 from being projected onto the wafer 123. The projection lenses 115, 119, the auxiliary lenses 117, 121, and the electromagnetic deflectors 116, 120 are controlled by the controller 131 via respective coil power supplies 115c, 119c, 117a, 121a, 116a, 120a.

Respective excitations of the lenses 115, 117, 119, 121 and of the electromagnetic deflectors 116, 120 are adjusted assuming the position of the reticle subfield (to be transferred to the substrate) and the corresponding imaging position (transfer subfield) on the wafer are exactly at their respective predetermined positions (i.e., "ideal" positions). Adjustments are made during exposure, such as shifting optical axes in VAL or VAIL projection optics and removing images of struts on the substrate to achieve good stitching of each imaged subfield (achieved mainly by the lenses 115, 119 and the deflectors 116, 120) as well as focus correction, rotation correction, and magnification correction of projected subfield images (achieved mainly by the lenses 117, 121). Hence, adjustment of the combined fields generated by the lenses and deflectors is important to achieve proper subfield exposures and positioning on the substrate.

An electrostatic deflector 130 is situated "inside" (within the inside diameter of) the electromagnetic deflector 120 (which is inside the auxiliary lens 121, which is inside the second projection lens 119). The electrostatic deflector 130 comprises opposing pairs of electrode plates on opposite sides of the optical axis; one pair of electrode plates is oriented in the X-direction and the other pair is oriented in the Y-direction. Respective electric fields are formed between the opposing pairs of electrode plates for deflecting the electron beam (patterned beam). The electrostatic deflector 130 is controlled, via a control power supply 130a, by the controller 131.

A backscattered-electron (BSE) detector 122 detects backscattered electrons produced by irradiated alignment marks on the wafer 123, and thus senses the positions of the alignment marks. These positional determinations are performed to determine the relative positions of the reticle 110 (or of projected images of the reticle pattern) and of the wafer 123 under given conditions of the projection-optical system.

In this embodiment, variances in horizontal position, rotation, and focus of an image produced by the projection-optical system are corrected by actions such as changing the position of the reticle stage 111, changing the position of the wafer stage 124, and/or appropriately energizing the deflectors 116, 120, 130 or image-adjustment lenses 117, 121. Corrections made by changing a position of a stage can be made over a relatively broad dimensional range, but are relatively slow in terms of response time. In contrast, corrections made by appropriately energizing an image-correction lens(es) and/or deflectors have a relatively narrow dimensional range, but are relatively fast in terms of response time. Corrections made using the electrostatic deflector 130 can be made especially rapidly. The system depicted in FIG. 1 allows various imaging corrections to be made using an appropriate combination of these different correction techniques to exploit the advantages of each.

Figure 2:
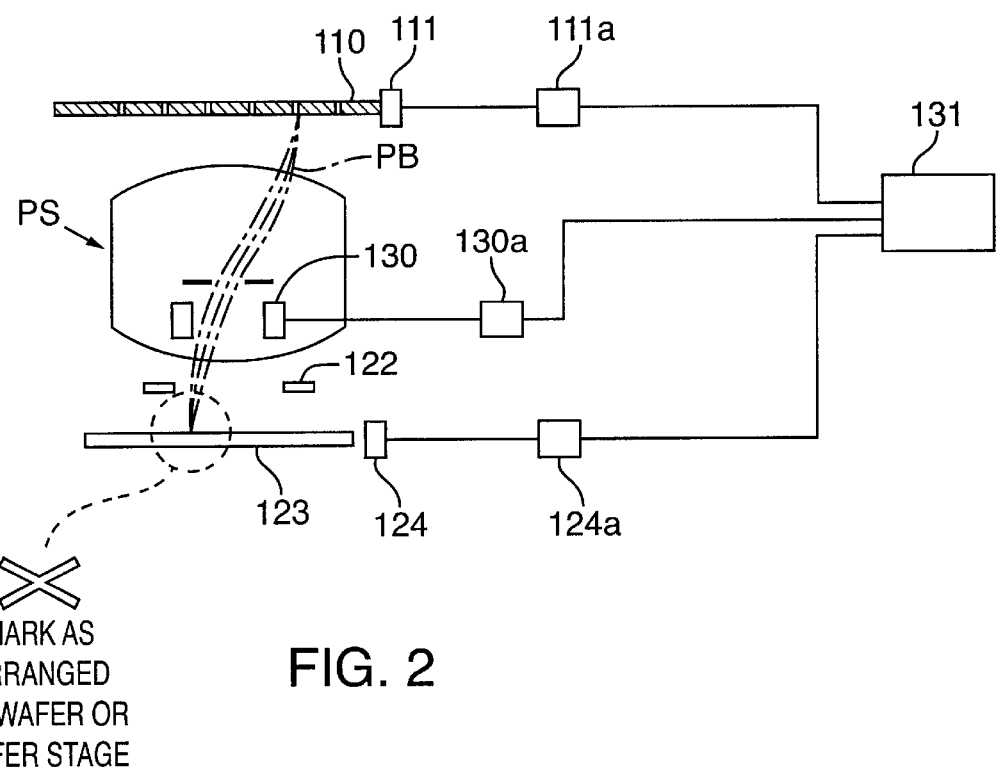
FIG. 2 is an elevational schematic diagram accompanying an explanation of the basic approach to stage-position-error correction, according to a representative embodiment, in an electron-beam microlithography apparatus according to the present invention.
Figure 3:
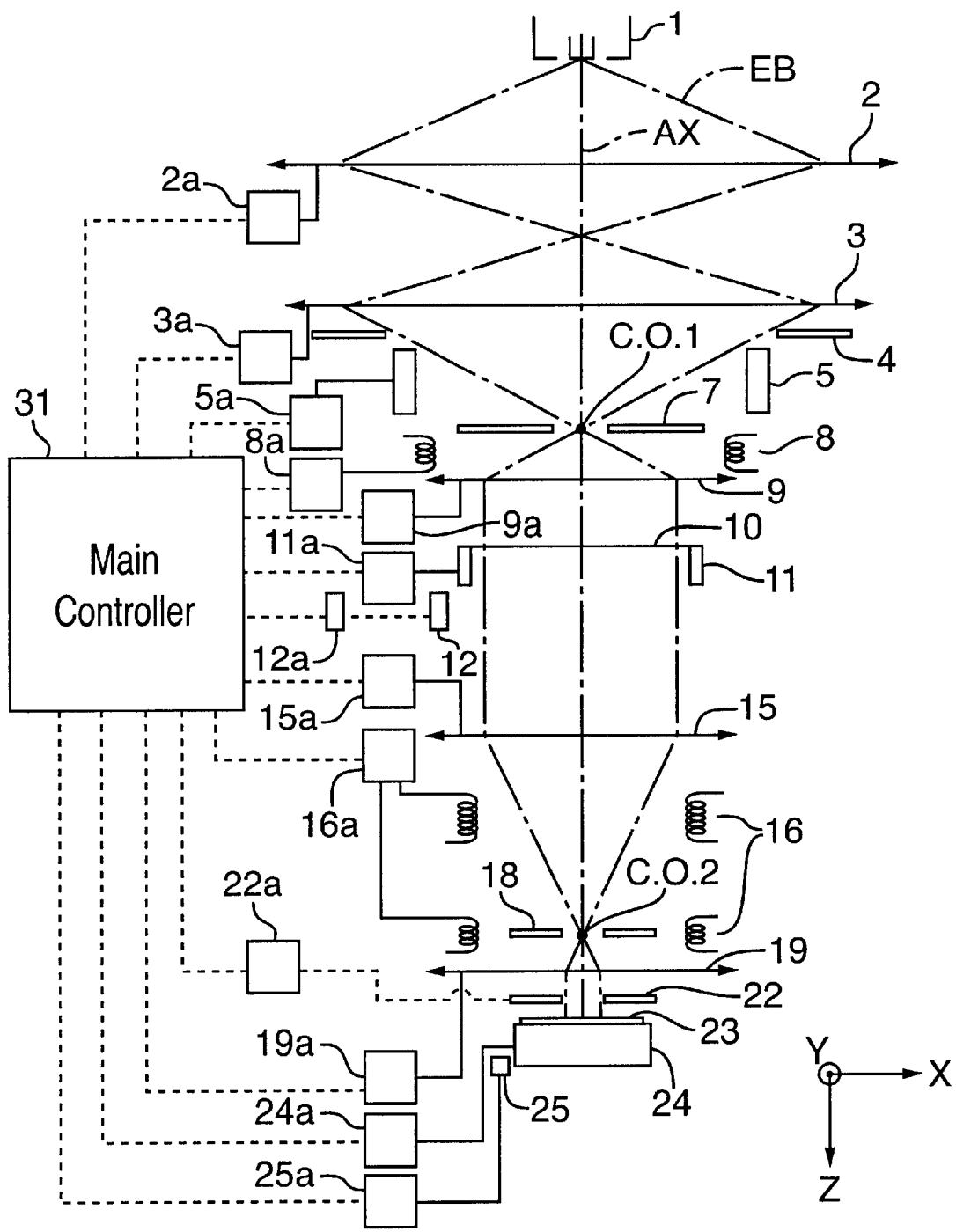
FIG. 3 is a schematic elevational depiction of principal components of the CPB-optical system and associated control systems of a conventional divided-reticle CPB microlithography apparatus.
Figure 4A:
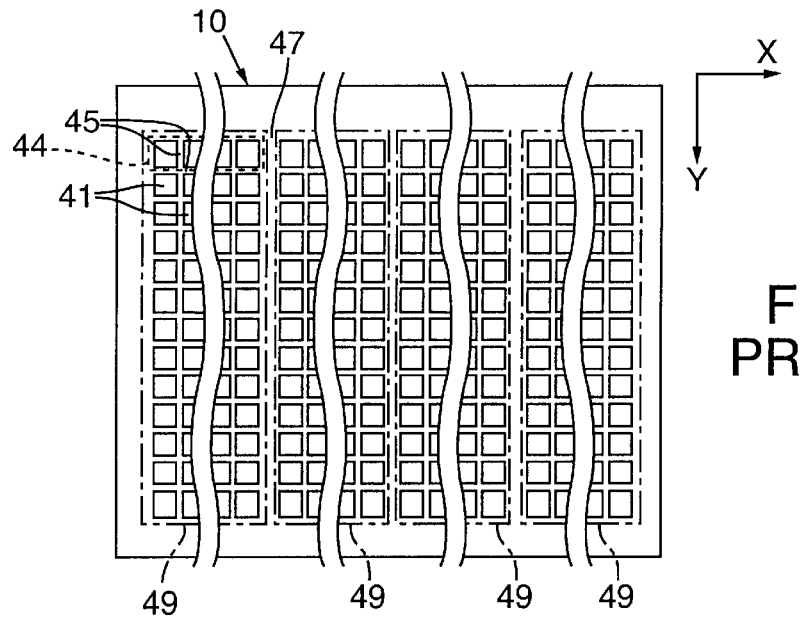
FIGS. 4(A)–4(C) schematically depict structural aspects of a conventional segmented reticle as used in an electron-beam microlithography apparatus as shown in FIG. 3.
Figure 4B:
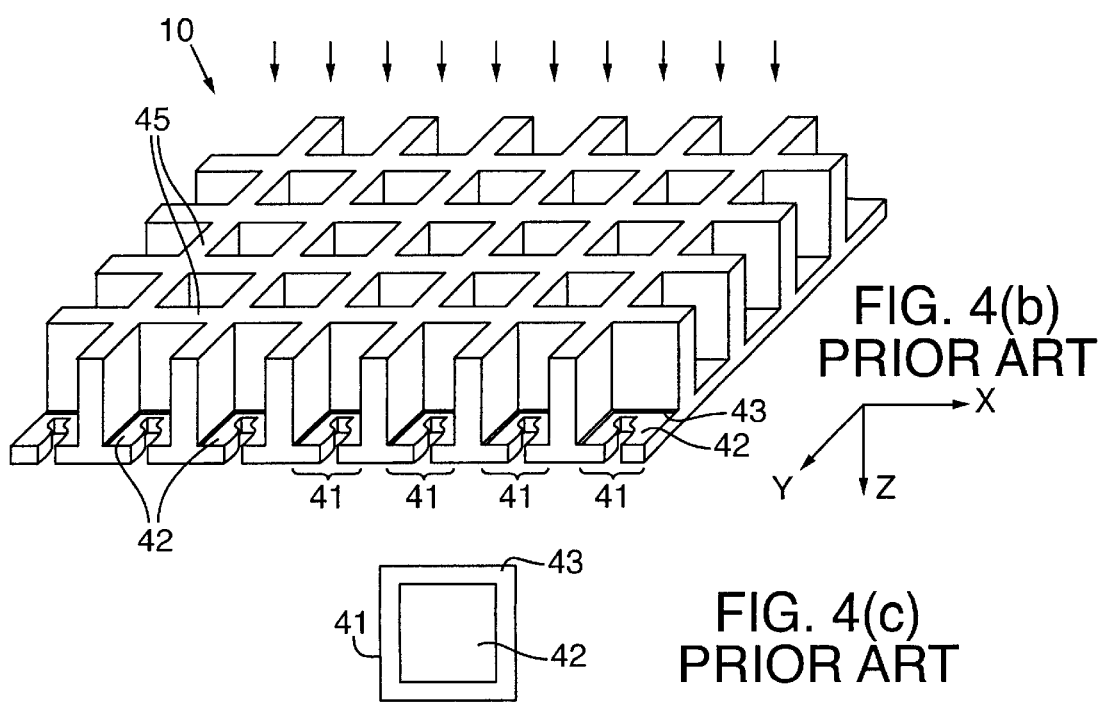
Figure 4C:
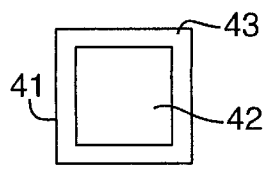
Figure 5:
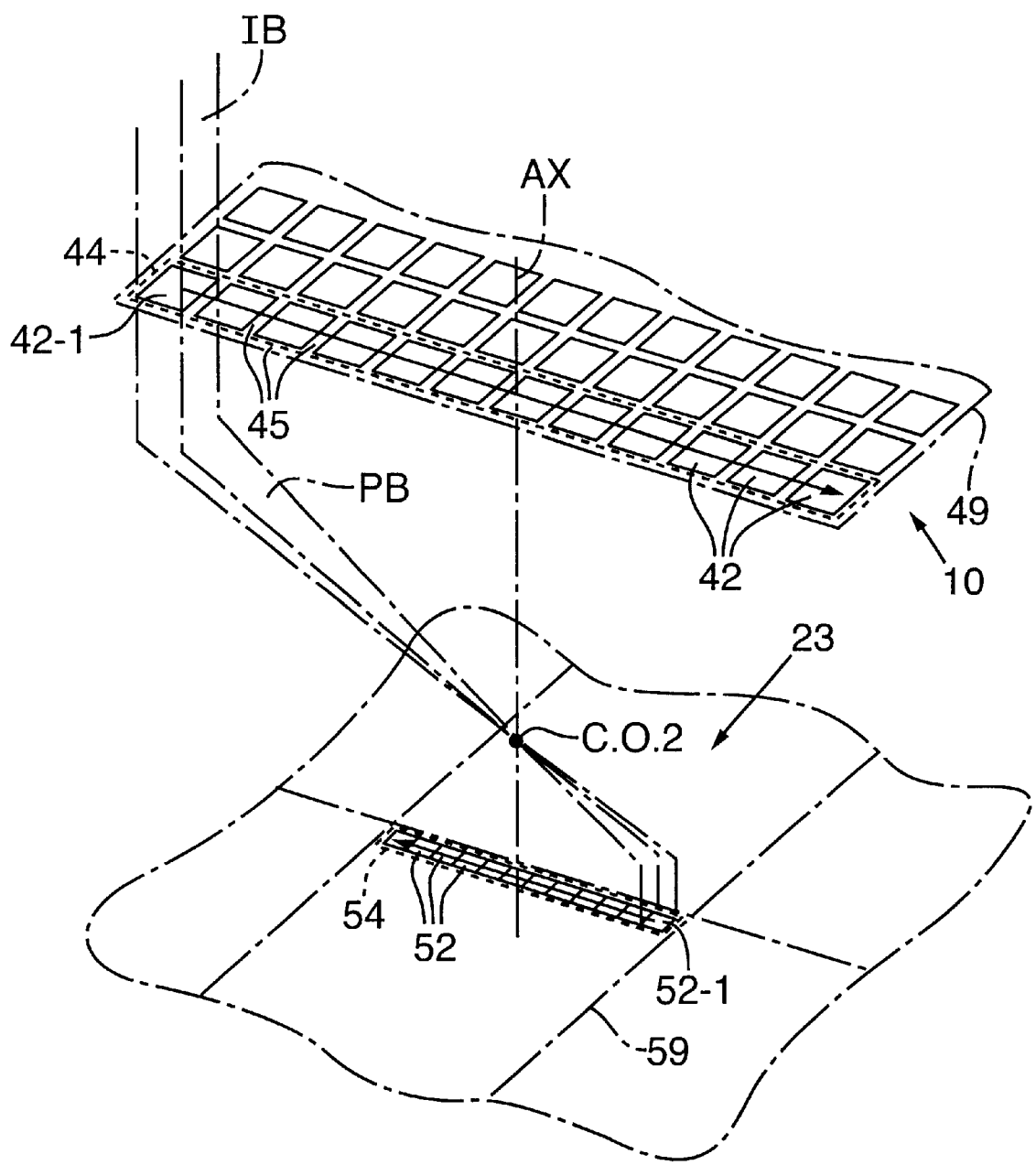
FIG. 5 is an isometric view showing a conventional manner in which a pattern is transferred microlithographically from a reticle to a wafer using a charged particle beam.

FIG. 2 depicts the basic approach to stage-position-error correction according to a representative embodiment of the invention. In FIG. 2, "PS" denotes the projection-optical system. All other reference numerals are similar to corresponding numerals used in FIG. 1.

Assume that an image of the reticle 110 is projected onto the surface of the wafer 123 by a patterned beam PB at a demagnification ratio of 1/M. The actual reticle-stage position during an exposure (shot) of a given subfield is denoted $P_{M\text{-}actual}$. If the ideal reticle position for the shot is $P_{M\text{-}ideal}$, then the error in reticle position can be expressed by:

$$\Delta P_M = P_{M\text{-}actual} - P_{M\text{-}ideal}$$

Similarly, with respect to the wafer 123, the relationship between actual wafer position, ideal wafer position, and error can be expressed by:

$$\Delta P_W = P_{W\text{-}actual} - P_{W\text{-}ideal}$$

Since the projection lenses 115, 119 collectively will reduce the error by the demagnification ratio of 1/M, the error on the wafer side, as "seen" by the reticle, is $(1/M)(\Delta P_M)$.

Corrections to the positions of both the reticle 110 and the wafer 123 can be made using only one electrostatic deflector (e.g., the deflector 130). At the wafer, the absolute value of the correction is $\Delta P_M/M + \Delta P_W$, and the corresponding correction is $-(\Delta P_M/M + P_W)$.

Also, whenever $\Delta P_W$ and/or $\Delta P_M$ is not zero, other positional errors will deviate from what they would be at the respective ideal positions. This applies to both the reticle 110 and the wafer 123. Thus, taking these additional error(s) into consideration, (i.e., deflection-based positioning errors at the reticle side ($P_{M\text{-}distortion}$, as measured at the wafer) and at the wafer side ($P_{W\text{-}distortion}$)), the error correction output to the electrostatic deflector 130 is:

$$-(\Delta P_M/M + \Delta P_W) + P_{M\text{-}distortion} + P_{W\text{-}distortion}$$

(Corrections to positional errors at the reticle side that are expressed in coordinate axis values at the wafer side will have the opposite sign.)

Hence, wafer-stage-positioning errors and reticle-stage-positioning errors both can be corrected using a single set of electrostatic deflectors to adjust the pattern-transfer location on the surface of the wafer. This is advantageous because less space is required to accommodate a single set of electrostatic deflectors, and only one set of power supplies and amplifiers is required to drive a single deflector.

Therefore, according to the invention, CPB microlithography apparatus are provided in which an electromagnetic deflector can be used to increase the pattern-transfer range. It also is possible, with such a configuration, to make rapid and accurate corrections for reticle- and wafer-stage-positioning errors (i.e., errors of displacement from respective ideal positions).

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) microlithography method in which an illumination beam is directed by an illumination-optical system to irradiate a region on a reticle mounted to a reticle stage and defining a pattern to be transferred to a sensitive substrate; and a corresponding patterned beam propagating downstream of the reticle from the irradiated region of the reticle is directed by a projection-optical system, comprising projection lenses, to projection-image the irradiated region of the reticle on an exposure surface of the sensitive substrate mounted to a wafer stage, a method for correcting at least one of a positional error ($\Delta P_w$) of the wafer stage and a positional error ($\Delta P_m$) of the reticle stage, the method comprising:

(a) providing an electrostatic deflector situated within the projection-optical system;

(b) providing respective electromagnetic deflectors situated within the illumination-optical system and the projection-optical system;

(c) measuring the respective positional errors ($\Delta P_M$, $\Delta P_W$) of the reticle stage and wafer stage, respectively from respective predetermined ideal positions;

(d) during exposure of the irradiated region of the reticle onto the substrate, energizing the electromagnetic deflector to reduce an aberration of the projection lenses, the energization of the electrostatic deflector being appropriate to impart a correction of $-(\Delta P_M/M + \Delta P_W)$, wherein 1/M is a demagnification ratio of the projection-optical system; $\Delta P_M = P_{M-actual} - P_{M-ideal}$, wherein $P_{M-actual}$ is an actual reticle-stage position during an exposure of a given subfield, and $P_{M-ideal}$ is a corresponding ideal reticle-stage position for $P_{M-actual}$; and $\Delta P_W = P_{W-actual} - P_{W-ideal}$, wherein $P_{W-actual}$ is an actual wafer-stage position during an exposure of the given subfield, and $P_{W-ideal}$ is a corresponding ideal wafer-stage position for $P_{W-actual}$.

2. The method of claim 1, further comprising the step of energizing at least one of the electromagnetic deflectors to correct at least some of the positional errors measured in step (c).

3. The method of claim 1, wherein:

the projection-optical system comprises first and second projection lenses, the second projection lens being situated closer to the substrate than the first projection lens; and step (a) comprises providing the electrostatic deflector within the second projection lens.

4. The method of claim 3, wherein:

the second projection lens comprises a respective auxiliary lens inside of which is situated the respective electromagnetic deflector; and step (a) comprises providing the electrostatic deflector inside the electromagnetic deflector.

5. The method of claim 4, wherein the first projection lens comprises a respective auxiliary lens, the method further comprising the step of energizing the respective auxiliary lenses of the first and second projection lenses during exposure of the irradiated region of the reticle so as to adjust focus, rotation, and demagnification of an image of the irradiated region of the reticle as formed on the substrate.

6. The method of claim 1, wherein the electrostatic deflector is energized to correct positional errors ($\Delta P_M$, $\Delta P_W$) as well as distortions ($P_{M-distortion}$, $P_{W-distortion}$), wherein $P_{M-distortion}$ is a deflection-based positional error caused by optical distortion arising from a position error at the reticle, as measured at the substrate, and $P_{PW-distortion}$ is a deflection-based positional error caused by optical distortion arising from a position error at the substrate.

7. The method of claim 1, wherein, in step (d), the electrostatic deflector is energized so as to provide a correction expressed as:

$$-(\Delta P_M/M + \Delta P_W) + P_{M-distortion} + P_{W-distortion}$$

wherein 1/M is a demagnification ratio of the projection-optical system; $\Delta P_M = P_{M-actual} - P_{M-ideal}$, wherein $P_{M-actual}$ is an actual reticle-stage position during an exposure of the reticle region, and $P_{M-ideal}$ is a corresponding ideal reticle-stage position for $P_{M-actual}$; and $\Delta P_W = P_{W-actual} - P_{W-ideal}$, wherein $P_{W-actual}$ is an actual wafer-stage position during the exposure of the region, and $P_{W-ideal}$ is a corresponding ideal wafer-stage position for $P_{W-actual}$; $P_{M-distortion}$ is a deflection-based positional error, as measured at the substrate, caused by distortion arising from a position error at the reticle, and $P_{W-distortion}$ is a deflection-based positional error caused by distortion arising from a position error at the substrate.

8. The method of claim 1, further comprising the steps of:

providing an alignment mark on the substrate or on the wafer stage;

irradiating the alignment mark with the charged particle beam so as to cause the alignment mark to produce backscattered electrons; and detecting the backscattered electrons to obtain a measurement of a positional relationship of the wafer stage to the projection-optical system.

9. The method of claim 8, wherein the steps of irradiating the alignment mark and detecting the backscattered electrons are performed before exposing the irradiated region of the reticle onto the substrate.

10. A charged-particle-beam (CPB) microlithography apparatus, comprising:

an illumination-optical system situated and configured to illuminate, with a charged particle beam, a region of a reticle defining a pattern to be transferred to a sensitive substrate;

a reticle stage situated and configured to hold and move the reticle as the reticle is being illuminated by the illumination beam, the illumination beam passing through the region becoming a patterned beam;

a wafer stage situated and configured to hold and move the sensitive substrate for exposure with the reticle pattern by the patterned beam;

a projection-optical system situated between the reticle stage and the wafer stage and configured to projection-image, on an exposure surface of the sensitive substrate, the patterned beam carrying an image of the illuminated region of the reticle, the projection-optical system comprising an electromagnetic deflector situated and configured to deflect the patterned beam so as to increase an area exposed by the patterned beam on the exposure surface, and an electrostatic deflector situated and configured to deflect the patterned beam sufficiently to correct a position error of the wafer stage or the reticle stage, or both stages, and thereby adjust a pattern-transfer position on the exposed surface; and a controller connected to the illumination-optical system, the projection-optical system, the reticle stage, the wafer stage, the electromagnetic deflector, and the electrostatic deflector, the controller being configured to cause the wafer stage to move continuously during an exposure shot of the patterned beam on the surface of the sensitive substrate, and to energize the electrostatic deflector during the exposure shot to correct the pattern-transfer position during the shot, the electrostatic deflector being energized, under control of the controller, to impart a correction of $-(\Delta P_M/M+\Delta P_W)$, wherein $1/M$ is a demagnification ratio of the projection-optical system; $\Delta P_M = P_{M\text{-}actual} - P_{M\text{-}ideal}$, wherein $P_{M\text{-}actual}$ is an actual reticle-stage position during an exposure of a given subfield, and $P_{M\text{-}ideal}$ is a corresponding ideal reticle-stage position for $P_{M\text{-}actual}$; and $\Delta P_W = P_{W\text{-}actual} - P_{W\text{-}ideal}$, wherein $P_{W\text{-}actual}$ is an actual wafer-stage position during an exposure of the given subfield, and $P_{W\text{-}ideal}$ is a corresponding ideal wafer-stage position for $P_{W\text{-}actual}$.

11. The apparatus of claim 10, wherein the controller is further configured to cause the electrostatic deflector to impart a positional correction of:

$$-(\Delta P_M/M+\Delta P_W)+P_{M\text{-}distortion}+P_{W\text{-}distortion}$$

wherein $P_{M\text{-}distortion}$ is a deflection-based positional error, measured at the substrate, caused by distortion arising from a position error at the reticle, and $P_{W\text{-}distortion}$ is a deflection-based positional error caused by distortion arising from a position error at the substrate.

12. The apparatus of claim 10, configured to perform an exposure of a subfield while the reticle stage and wafer stage are continuously moving, wherein the controller causes the electrostatic deflector to correct the position error during the exposure.

* * * * *

UNITED STATES PATENT AND TRADEMARK OFFICE
CERTIFICATE OF CORRECTION

PATENT NO. : 6,376,137 B1  Page 1 of 1
DATED : April 23, 2002
INVENTOR(S) : Okino It is certified that error appears in the above-identified patent and that said Letters Patent is hereby corrected as shown below:

Column 1,
Line 16, "used" should be -- use --.

Column 10,
Line 25, "reticle stage 11" should be -- reticle stage 111 --.

Column 14,
Line 2, "$P_{W\text{-distortion}}$" should be -- $P_{W\text{-distortion}}$ --.

Signed and Sealed this

Eleventh Day of February, 2003

JAMES E. ROGAN
*Director of the United States Patent and Trademark Office*